United States Patent
Higo et al.

(10) Patent No.: US 8,437,180 B2
(45) Date of Patent: May 7, 2013

(54) MEMORY AND WRITE CONTROL METHOD

(75) Inventors: Yutaka Higo, Kanagawa (JP); Masanori Hosomi, Kanagawa (JP); Minoru Ikarashi, Kanagawa (JP); Hiroshi Kano, Kanagawa (JP); Shinichiro Kusunoki, Kanagawa (JP); Hiroyuki Ohmori, Kanagawa (JP); Yuki Oishi, Kanagawa (JP); Kazutaka Yamane, Kanagawa (JP); Tetsuya Yamamoto, Kanagawa (JP); Kazuhiro Bessho, Kanagawa (JP)

(73) Assignee: Sony Corporation, Tokyo (JP)

( * ) Notice: Subject to any disclaimer, the term of this patent is extended or adjusted under 35 U.S.C. 154(b) by 325 days.

(21) Appl. No.: 12/795,933

(22) Filed: Jun. 8, 2010

(65) Prior Publication Data

US 2010/0328998 A1    Dec. 30, 2010

(30) Foreign Application Priority Data

Jun. 24, 2009   (JP) ................ P2009-149902

(51) Int. Cl.
*G11C 11/00*   (2006.01)

(52) U.S. Cl.
USPC ........... 365/158; 365/148; 365/171; 977/933; 977/935

(58) Field of Classification Search ............ 365/48, 365/55, 62, 66, 74, 78, 80–93, 100, 130, 365/131, 148, 158, 171–173, 209, 213, 225.5, 365/230.07, 232, 243.5; 216/2; 257/421, 257/E21.665; 438/3; 428/810–816, 817–825.1, 428/826; 977/933–935
See application file for complete search history.

(56) References Cited

U.S. PATENT DOCUMENTS

| 5,695,864 | A | 12/1997 | Slonczewski |
| 7,324,138 | B2 | 1/2008 | Yamamoto |
| 2003/0072174 | A1 | 4/2003 | Savtchenko et al. |
| 2005/0041456 | A1* | 2/2005 | Saito ........................... 365/145 |
| 2006/0233017 | A1* | 10/2006 | Hosotani et al. ............ 365/158 |
| 2007/0058422 | A1* | 3/2007 | Phillips et al. .............. 365/158 |
| 2007/0097730 | A1* | 5/2007 | Chen et al. .................. 365/158 |
| 2008/0019058 | A1* | 1/2008 | Saito ........................ 360/324.1 |

FOREIGN PATENT DOCUMENTS

| JP | 10-116490 | 5/1998 |
| JP | 2003-17782 | 1/2003 |
| JP | 2005-277147 | 10/2005 |

OTHER PUBLICATIONS

J. Nahas et al., IEEE/ISSCC 2004 Visulas Supplement, p. 22.

* cited by examiner

*Primary Examiner* — Harry W Byrne
(74) *Attorney, Agent, or Firm* — K&L Gates LLP (57) ABSTRACT

A memory includes: a memory device that has a memory layer storing data as a magnetization state of a magnetic body and a magnetization fixed layer whose direction of magnetization is fixed through a nonmagnetic layer interposed between the memory layer and the magnetization fixed layer and stores the data in the memory layer by changing a magnetization direction of the memory layer when a write current flowing in a stacked direction of the memory layer and the magnetization fixed layer is applied; and a voltage control unit that supplies the write current configured by independent pulse trains of two or more to the memory device by using a write voltage that is configured by independent pulse trains of two or more.

10 Claims, 6 Drawing Sheets

MEMORY AND WRITE CONTROL METHOD

CROSS REFERENCES TO RELATED APPLICATIONS

The present application claims priority to Japanese Priority Patent Application JP 2009-149902 filed in the Japan Patent Office on Jun. 24, 2009, the entire content of which is hereby incorporated by reference.

BACKGROUND

The present application relates to a memory and a write control method that are configured by a memory layer storing the magnetization state of a magnetic body as data and a magnetization fixed layer whose direction of magnetization is fixed and that store data in a memory device by changing the direction of magnetization of the memory layer by allowing a current to flow in the stacked direction.

In related art, as the use of information communication devices, especially, miniaturized electronic devices used particularly in mobile terminals and the like become widespread, it is desirable for devices such as memories or logic circuits configuring the electronic devices to have improved performance such as high-density integration, high operation speed, low power consumption, or the like.

In such electronic devices, non-volatile memories are considered to be major components used for improving the functions of the electronic devices. As the non-volatile memory, a semiconductor flash memory, a FeRAM (Ferroelectric non-volatile memory), and the like have been practically implemented, and researches and developments for further improving the performance thereof are being actively undertaken.

Recently, as new non-volatile memories each using a magnetic body, the development of MRAMs (Magnetic Random Access Memories) utilizing a tunnel magnetoresistive effect has advanced markedly. Relating to the MRAMs, for example, a technology disclosed in J. Nahas et al., IEEE/ISSCC 2004 Visulas Supplement, p. 22 and the like has attracted attention.

In the MRAM, tiny memory devices storing data are regularly disposed and are wired such that each of the tiny memory devices can be accessed. The wires have a structure in which, for example, word lines and bit lines are disposed. Each memory device is configured to include a memory layer storing data as the direction of magnetization of a ferromagnetic body.

As memory devices, magnetic memory devices employing a structure utilizing a so-called magnetic tunnel junction (MTJ) are used. The magnetic tunnel junction is configured by the above-described memory layer, a tunnel insulating layer (nonmagnetic spacer film), and a magnetization fixed layer whose direction of magnetization is fixed. For example, the direction of magnetization of the magnetization fixed layer can be fixed by disposing an antiferromagnetic layer.

In such a structure, a so-called tunnel magnetoresistive effect that changes a resistance value for a tunnel current flowing through the tunnel insulating layer in accordance with an angle formed by the direction of magnetization of the memory layer and the direction of magnetization of the magnetization fixed layer occurs. Accordingly, data can be read out by using the tunnel magnetoresistive effect. The resistance value has a maximum value when the magnetization directions of the memory layer and the magnetization fixed layer are antiparallel to each other. On the other hand, the resistance value has a minimum value when the magnetization directions of the memory layer and the magnetization fixed layer are parallel to each other.

In related art, as a method of storing data (hereinafter, it may be abbreviated as "data writing" or "write") by writing data into a memory device, for example, a technology utilizing asteroid characteristics is disclosed in JP-A-10-116490. In addition, a technology utilizing switching characteristics is disclosed in U.S. Patent Application Publication No. 2003/0072174.

In particular, the writing of data into a memory device is performed as follows. In other words, data is written by controlling the magnetization direction of the memory layer of the memory device in accordance with a synthetic current magnetic field that is generated by allowing currents to flow through both a word line and a bit line that are disposed to the upper and lower sides of the memory device and are disposed to be perpendicular to each other. Generally, a difference in the magnetization directions at the time of writing data is written into the memory device in correspondence with data "0" and data "1".

On the other hand, a method of reading out data (hereinafter, it may be abbreviated as "reading out data" or "read") from the memory device 2 is performed as follows. A memory cell is selected by using a device such as a transistor, and a difference in the magnetization directions of the memory layer is detected as a difference in a voltage signal by utilizing the tunnel magnetoresistive effect of the memory device. Accordingly, the written data can be detected.

In the MRAM, data "0" and data "1" are written by reversing the magnetization direction of the memory layer that is configured by a ferromagnetic body. Accordingly, when the MRAM is compared to other non-volatile memories, the best feature of the MRAM is that data rewriting can be performed an almost unlimited number of times (for example, $10^{15}$ times) at a high speed.

However, in the MRAM, in order to rewrite the data written once, it is necessary to generate a relatively large current of a degree (for example, several mA to several tens of mA) for an address wire. In such a case, the power consumption becomes high.

In addition, in the MRAM, an address wire for writing and an address wire for reading are used for each memory device. Accordingly, it is difficult to structurally miniaturize the memory cell.

In addition, the address wires become thin in accordance with miniaturization of the memory device. Accordingly, it is difficult to allow a sufficient current to flow, and coercivity increases. Therefore, there are cases where a necessary current magnetic field is increased and the power consumption increases. As a result, it is difficult to miniaturize the memory device.

Thus, in order to solve the above-described problems, technologies for writing data into a memory device without using a current magnetic field have been researched. In particular, in order to implement a configuration in which magnetization reversal can be performed by using a relatively low current, memories that are configured so as to utilize magnetization reversal caused by a spin transfer as described in U.S. Pat. No. 5,695,864 have attracted attention.

Here, in JP-A-2003-17782, magnetization reversal caused by a spin transfer is described. The magnetic inversion caused by spin transfer is to generate magnetization reversal in a magnetic body by injecting spin-polarized electrons passing through the inside of another magnetic body into the magnetic body.

According to this phenomenon, when the spin-polarized electrons passing through a magnetic layer (magnetization fixed layer) whose direction of magnetization is fixed are moved into a different magnetic layer whose direction of magnetization is not fixed, torque is applied to magnetization of the different magnetic layer (magnetization free layer). Then, by allowing a current having a predetermined threshold value or higher to flow through the different magnetic body, the direction of magnetization of the magnetic layer can be inverted.

For example, a current is allowed to flow through a giant magnetoresistive effect device (GMR device: Giant Magneto Resistive Head) or a magnetic tunnel junction device (MTJ device) that has a magnetization fixed layer and a magnetization free layer in a direction perpendicular to the layer faces. Accordingly, the direction of magnetization of at least a part of the magnetic layer of the device can be reversed.

Then, a memory device having a magnetization fixed layer and a magnetization free layer (memory layer) is configured, and by changing the polarity of a current flowing through the memory device, the magnetization direction of the memory layer is reversed, whereby rewriting for a shift from data "0" to data "1" and a shift from data "1" to data "0" is performed.

On the other hand, in the reading out of written data, by using a configuration in which a tunnel insulating layer is disposed between the magnetization fixed layer and the magnetization free layer (memory layer), similarly to the MRAM, the tunnel magnetoresistive effect can be utilized.

The magnetization reversal caused by a spin transfer has an advantage in that magnetization reversal can be achieved without increasing the current even in a case where the memory device is miniaturized.

For example, the absolute value of the current flowing through the memory device for magnetization reversal is equal to or smaller than 1 mA for a memory device having a scale of about 0.1 μm. In addition, since the absolute value of the current decreases in proportion to the volume of the memory device, scaling up is advantageous. In addition, the word line for storage, which is disposed in the MRAM, is not necessary. Accordingly, there is an advantage in that the configuration of the memory cell is simplified.

In the description below, a memory device using a spin transfer is referred to as a SpRAM (Spin transfer Random Access Memory). In addition, a spin-polarized electron stream that causes the spin transfer is referred to as a spin injection current.

As a non-volatile memory capable of implementing low power consumption and high capacity with the advantages of the MRAM maintained, which includes a high speed operation and an almost unlimited number of times of rewriting, the SpRAM is highly anticipated.

In addition, JP-A-2005-277147 is also an example of related art.

SUMMARY

However, in the SpRAM, in order to write data in the memory device, a write current is allowed to flow in the stacked direction of the memory device. At that time, a voltage in the range of about 0.5 V to 1 V is generated across a tunnel insulating layer of the memory device. This voltage is not negligible relative to the breakdown voltage of the tunnel insulating layer. In other words, when a write operation is repeatedly performed, and the tunnel insulating layer receives an electric field stress, there are cases where the tunnel insulating layer is electro-statically broken down. The resistance of the memory device is not changed even when a write operation is performed, and the resistance of the memory device whose tunnel insulating layer is electro-statically broken down decreases markedly. Accordingly, it is difficult to read out data in accordance with a change in the resistance.

As described above, for the SpRAM, a difference between a voltage (hereinafter, referred to as a write voltage) applied to the tunnel insulating layer for writing and a voltage (hereinafter, referred to as breakdown voltage) at which the tunnel insulating layer is electro-statically broken down is configured to be sufficiently large. In a case where the difference is small, it is difficult to configure a memory of high capacity due to characteristic variances of memory devices.

Thus, it is desirable to store data in a memory device with breakdown of the memory device being prevented by reversing the magnetization direction of the memory layer by applying a write current that is generated in accordance with a low write voltage.

According to an embodiment, data is stored in a memory device.

The memory device includes a memory layer that stores data as the magnetization state of a magnetic body and a magnetization fixed layer whose magnetization direction is fixed through a nonmagnetic layer interposed between the memory layer and the magnetization fixed layer.

Then, by applying a write current flowing in the stacked direction of the memory layer and the magnetization fixing layer, the magnetization direction of the memory layer is changed, whereby data is stored in the memory layer.

At this time, the write current is supplied to the memory device by a write voltage that is formed by independent pulse trains of two or more.

According to an embodiment, data can be stored in the memory device by supplying the write current to the memory device by a write voltage formed by independent pulse trains of two or more in the stacked direction of the memory layer and the magnetization fixed layer.

According to an embodiment, a write current is supplied by a write voltage that is formed by independent pulse trains of two or more. Accordingly, data can be stored in the memory device even in accordance with a low voltage by reversing the magnetization direction of the memory layer. Therefore, electrostatic breakdown of the memory device can be prevented, and there is an advantage in that the life of the memory device can be lengthened.

Additional features and advantages are described herein, and will be apparent from the following Detailed Description and the figures.

DETAILED DESCRIPTION

The present application will be described below in greater detail with reference to the drawings according to an embodiment. The detailed description is provided as follows.

1. First Embodiment (Write Control: Example of Writing Using Two or More Pulse Trains)
2. Second Embodiment (Write Control: Example of Changing Number of Pulse Trains by Determining Whether Writing Is Successful)
3. Modified Examples
<1. First Embodiment>
[Example of Writing Using Two or More Pulse Trains]

Hereinafter, a first embodiment will be described with reference to FIGS. 1 to 7. In this embodiment, an example in which the present invention is applied to a memory (hereinafter referred to as SpRAM1) writing data into a memory device by using two or more pulse trains will be described.

Figure 1:
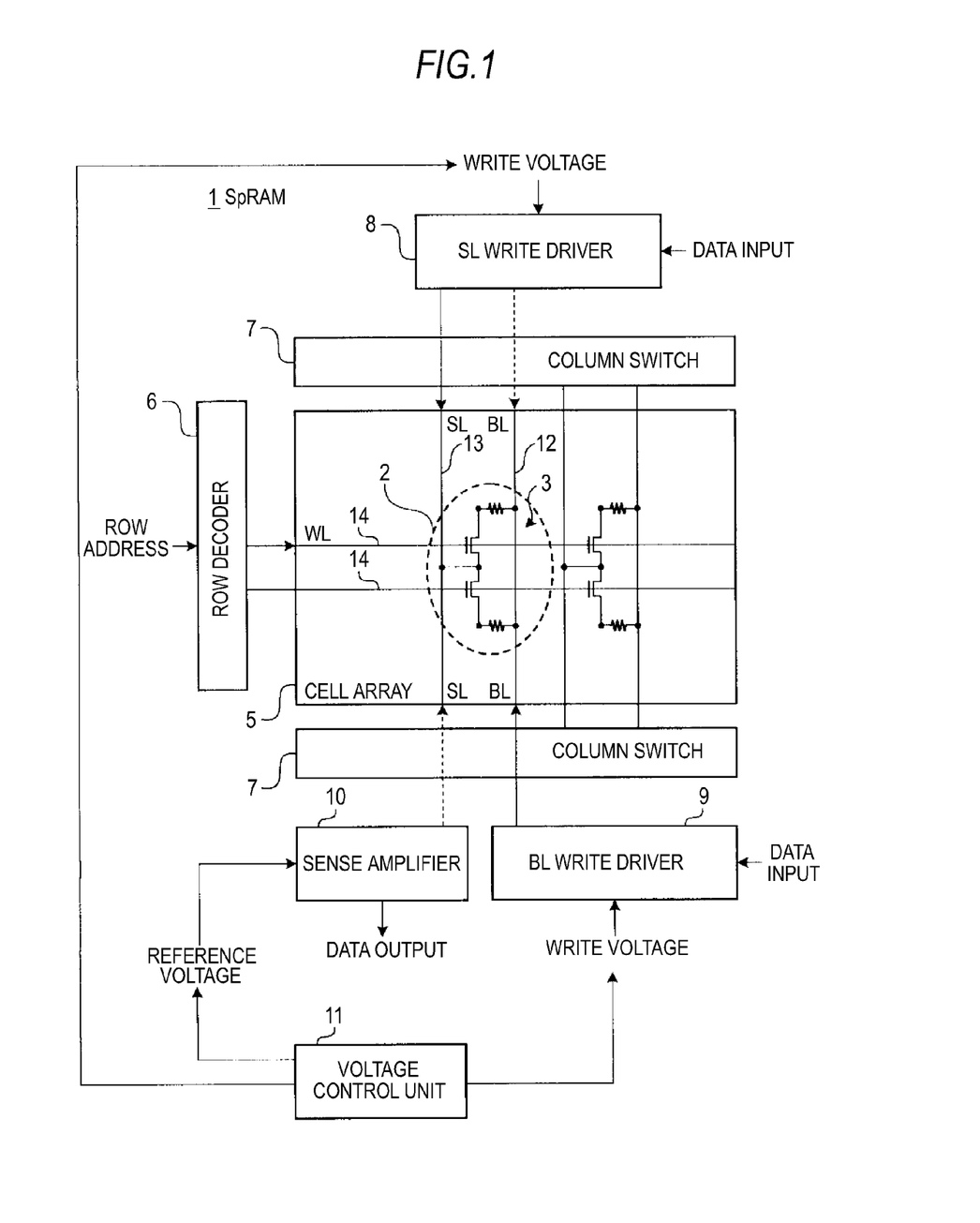
FIG. 1 is a functional block diagram representing an internal configuration example of an SpRAM according to a first embodiment.

FIG. 1 is a functional block diagram representing an internal configuration example of the SpRAM1.

Here, memory devices 2 storing data are disposed in an array shape so as to configure a cell array 5. Each memory device 2 is connected to a bit line 12 (BL) and a source line 13 (SL), which vertically extend on the cell array 5, through a selection MOS transistor 3 and stores data of one bit that is "0" or "1". On the other hand, the gate of the selection MOS transistor 3 is connected to a word line 14 (WL) horizontally extending on the cell array 5.

In FIG. 1, the cell array 5 having the configuration of 4 rows×4 columns is shown. However, in practical applications, the configuration may be scaled up. Thus, for example, the configuration of 512 rows×512 columns may be used. In such a case, the numbers of the word lines 14, the bit lines 12, and the source lines 13 respectively are 512. The left end of each word line 14 is connected to a row decoder 6 that is disposed to the left side of the cell array 5, and the right end thereof is opened. The upper and lower ends of each source line 13 and each bit line 12 are connected to column switches 7 that are disposed above and below the cell array 5.

In a case where the cell array 5 is configured to have 512 rows×512 columns, the length of the address is 18 bits. Thus, higher-order 9 bits are assigned to a row address, and lower-order 9 bits are assigned to a column address. The row address is input to the row decoder 6, and the column address is input to the column switches 7 disposed on the upper and lower sides.

In addition, the SpRAM1 includes an SL write driver 8 that applies a write voltage to the source line 13 and a BL write driver 9 that applies a write voltage to the bit line 12. Both the SL write driver 8 and the BL write driver 9 serve as a write unit that writes data into the memory device 2. The write voltage used by the write unit for writing data into a memory block and a reference voltage supplied to the sense amplifier 10 are controlled by the voltage control unit 11. The voltage control unit 11 of this example supplies a write current to be written to the memory device to the write unit by a write voltage that is formed by two or more independent pulse trains.

In addition, the SpRAM1 includes the sense amplifier 10 which is connected to the source line 13 and to which a sense voltage that is used for allowing a current read out from the memory device 2 to flow is input. One memory device 2 stores data of one bit, and a reference voltage having a predetermined level is input to the sense amplifier 10. The sense amplifier 10 reads out the data written in the memory device 2 by comparing the sense voltage and the reference voltage together. The sense amplifier 10 of this example serves as a read unit that reads out data from the memory device 2.

Next, an example of the internal configuration of a memory cell of the memory (SpRAM1) using a spin transfer will be described.

Figure 2:
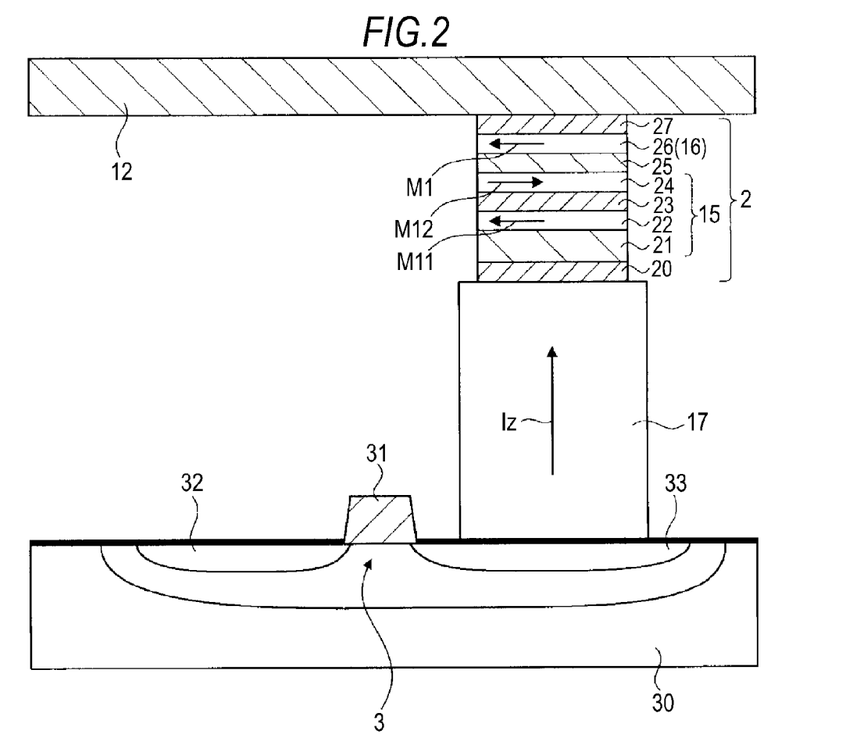
FIG. 2 is a schematic cross-sectional view of a memory cell of a memory, which uses a spin transfer, according to the first embodiment.

FIG. 2 represents a schematic cross-sectional view of a memory device 2 and a memory cell.

The entire structure represented in FIG. 2 shows the memory cell. In order to electrically select a memory cell for reading out data stored in the memory device 2, a diode, an MOS transistor, or the like may be used. The memory cell shown in FIG. 2 uses an MOS transistor.

First, a configuration example of the memory cell will be described.

A ferromagnetic layer 22 and a ferromagnetic layer 24 are disposed with a nonmagnetic layer 23 interposed therebetween, thereby forming antiferromagnetic coupling. In addition, the ferromagnetic layer 22 disposed on the lower layer side is disposed so as to be brought into contact with an antiferromagnetic layer 21. Accordingly, the ferromagnetic layer 22 has strong magnetic anisotropy for one direction due to exchange interaction working between the above-described layers. A magnetization fixed layer 15 whose magnetization direction is fixed is configured by the above-described layers 21, 22, 23, and 24. In other words, the magnetization fixed layer 15 is configured by a plurality of (in this example, two) of the ferromagnetic layers 22 and 24 that are stacked through a nonmagnetic layer.

A ferromagnetic layer 26 is configured such that the direction of magnetization M1 thereof can be relatively easily rotated, and a memory layer (magnetization free layer) 16 is configured by the ferromagnetic layer 26. The memory layer 16 stores data as the magnetization state of the magnetic body.

Between the ferromagnetic layer 24 of the magnetization fixed layer and the ferromagnetic layer 26, that is, between the magnetization fixed layer 15 and the memory layer 16, a tunnel insulating layer 25 is formed. This tunnel insulating layer 25 has a function for cutting the magnetic coupling of the upper and lower ferromagnetic layers 26 and 24 and allowing a tunnel current to flow. Accordingly, a TMR (tunnel magnetoresistive effect) device is configured by the magnetization fixed layer 15 whose magnetization direction of the magnetic layer is fixed, the tunnel insulating layer 25, and the memory layer 16 whose magnetization direction can be changed.

Thus, the memory device 2 that is formed from the TMR device by the above-described layers 21 to 26, a basic film 20, and an overcoat layer 27 is configured.

When a write current flowing in the stacked direction is applied, the memory device 2 can store data in the memory layer 16 by changing the magnetization direction of the memory layer 16.

The material of each layer configuring the memory device 2 is as follows.

As the material of the antiferromagnetic layer 21, for example, PtMn can be used.

As the material of the ferromagnetic materials 22 and 24 of the magnetization fixed layer 15, a ferromagnetic material such as CoFe can be used.

As the material of the nonmagnetic layer 23, for example, Ru, Ta, Cr, Cu, or the like can be used.

As the material of the tunnel insulating layer 25, for example, MgO can be used.

As the material of the ferromagnetic layer 26 of the memory layer 16, a ferromagnetic material such as CoFeB can be used.

In a silicon substrate 30, the selection MOS transistor 3 is formed. A connection plug 17 is formed on a diffusion layer 33 that is disposed on one side of the selection MOS transistor 3. To the connection plug 17, the basic film 20 of the memory device 2 is connected. A diffusion layer 32 disposed on the other side of the selection MOS transistor 3 is connected to a source line 13 through a connection plug not shown in the figure. The gate 31 of the selection MOS transistor 3 is connected to the word line 14 through a connection plug not shown in the figure. The overcoat layer 27 of the memory device 2 is connected to the bit line 12 that is disposed thereon.

In a normal state, the magnetization M11 of the ferromagnetic layer 22 and the magnetization M12 of the ferromagnetic layer 24 are in an approximately complete antiparallel state due to antiferromagnetic coupling through the nonmagnetic layer 23.

Commonly, the ferromagnetic layer 22 and the ferromagnetic layer 24 are configured to have the same magnetic moment. Accordingly, the leakage component of magnetic fields at the magnetic poles is negligibly small.

The resistance value of the TMR device that is configured by the layers 24, 25, and 26 changes depending on whether the direction of the magnetization M1 of the ferromagnetic layer 26 of the memory layer 16 and the direction of the magnetization M12 of the ferromagnetic layer 24 of the magnetization fixed layer 15, which have the tunnel insulating layer 25 interposed therebetween, is in the parallel state or the antiparallel state. In the state in which two magnetizations M1 and M12 are in the parallel state, the resistance value decreases. On the other hand, in the antiparallel state, the resistance value increases. When the resistance value of the TMR device changes, the resistance value of the entire memory device 2 is also changed. By utilizing the above-described phenomenon, data can be written into or read out from the memory device 2. For example, binary data (one bit) can be written by assigning the state having the low resistance value to data "0" and assigning the state having the high resistance value to data "1".

In addition, the ferromagnetic layer 24 of the magnetization fixed layer 15 that is disposed on the memory layer 16 side is a ferromagnetic layer that is referred to as the reference of the direction of the magnetization M1 of the memory layer 16 when stored data is read out. Thus, the ferromagnetic layer 24 is also referred to as a "reference layer".

In order to rewrite data of a memory cell or read out data written in a memory cell, a spin injection current Iz is allowed to flow. This spin injection current Iz passes through the diffusion layer 33, the memory device 2, and the bit line 12.

When the polarity of the spin injection current Iz is changed, the direction of the spin injection current Iz flowing through the memory device 2 can be changed from the upward direction to the downward direction or from the downward direction to the upward direction.

Accordingly, the direction of the magnetization M1 of the memory layer 16 is changed, whereby the data of the memory cell can be rewritten.

Next, an example of a data writing operation that is performed by the write unit will be described.

The row decoder 6 sets the voltage of one of 512 word lines 14 to a power source voltage in accordance with a row address and turns on the selection MOS transistor 3 that is connected to the corresponding word line 14. The column switch 7 disposed on the upper side connects one of 512 source lines 13 to the SL write driver 8 in accordance with a column address. The column switch 7 disposed on the lower side connects one of 512 bit lines 12 to the BL write driver 9 in accordance with the column address.

The SL write driver 8 outputs the write voltage when the data input is "1". On the other hand, the SL write driver 8 outputs GND when the data input is "0". On the contrary, the BL write driver 9 outputs the write voltage when the data input is "0". On the other hand, the BL write driver 9 outputs GND when the data input is "1". Accordingly, the direction of the current is changed in accordance with the data input, whereby a write operation of data of "0" or "1" for the selected memory device 2 can be performed.

Next, an example of a data reading operation that is performed by the sense amplifier 10 will be described.

The selection of the word line 14 is the same as that for data writing. The column switch 7 disposed on the upper side connects one of 512 bit lines 12 to the SL write driver 8 in accordance with the column address. The column switch 7 disposed on the lower side connects one of 512 source lines 13 to the sense amplifier in accordance with the column address. The SL write driver 8 typically outputs GND. Accordingly, a constant read current is allowed to flow from the sense amplifier 10 to the selected memory device 2.

In a case where the state of the memory device 2 is "1", that is, in the case of a high resistance state, the sense voltage used for allowing the read current to flow is assumed to be V1. Similarly, in a case where the state of the memory device 2 is "0", that is, in the case of a low resistance state, the sense voltage used for allowing the read current to flow is assumed to be V0. At this time, V1>V2 due to the magnitude relationship of resistance values. Thus, a reference voltage that is lower than V1 and is higher than V2 is input to the sense amplifier 10.

The sense amplifier 10 compares the sense voltage and the reference voltage together. Here, in the case of "sense voltage>reference voltage", the memory device 2 can be determined to be in a state in which "1" is stored therein. On the other hand, in the case of "sense voltage<reference voltage", the memory device 2 can be determined to be in a state in which "0" is stored therein. In other words, the data reading operation can be performed.

Next, the error rate of the SpRAM1 will be described. Here, only the error rate for writing data into the memory device 2 of this example will be described.

For describing a detailed write operation of the SpRAM1, it is assumed that the directions of the magnetization M12 of the reference layer (ferromagnetic layer 24) and the magnetization M1 of the memory layer 16 are in a parallel state in the initial state, and the directions are changed to be in an antiparallel state by allowing a write current (spin injection current Iz) to flow. Here, even when the directions of the magnetization M12 of the reference layer (ferromagnetic layer 24) and the magnetization M1 of the memory layer 16 are in the parallel state, the relative angle of the magnetizations is not exactly zero degrees. The direction of the magnetization M1 of the memory layer 16 has a distribution having zero degrees as its center and constantly swings due to the influence of heat fluctuation. As the relative angle of the magnetization M12 of the reference layer (the ferromagnetic layer 24) and the magnetization M1 of the memory layer 16 increases, the force of spin injection becomes stronger.

In other words, in a case where the relative angle of the magnetizations M1 and M12 is large when the write current flows, the state can be changed to the antiparallel state by a small current. On the contrary, in a case where the relative angle of the magnetizations M1 and M12 is small, the application of a large current is necessary. The directions in which the magnetizations M1 and M12 face when the write current flow are completely probabilistic. In other words, when the same current flows through the same element, it is possible that there are cases where the state is changed to the antiparallel state and cases where the parallel state remains. Remaining in the parallel state indicates that the write operation is failed.

Figure 3:
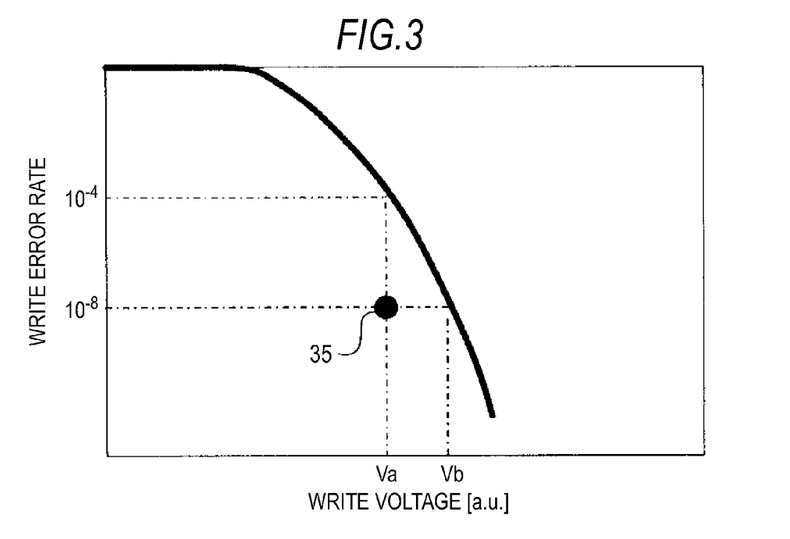
FIG. 3 is a diagram representing a relationship between a write voltage and a write error rate when the write voltage is applied to the memory device according to the first embodiment.

FIG. 3 schematically shows an example of the write error rate for a write voltage.

The horizontal axis represents a write voltage, and the vertical axis (log) represents a write error rate. The write error rate of $10^{-4}$ at a time when a write voltage Va. is applied to the memory device 2 corresponds to a case where one write operation is failed out of 10,000 write operations. As can be seen from the figure, as the write voltage is increased, the write error rate rapidly decreases. For example, when the write voltage is increased from Va. to Vb, the write error rate decreases to the frequency of one out of $10^8$. As described above, in order to perform a write operation without any problem, it is preferable that the write voltage is increased. The description presented above is for a case where the state is changed from the antiparallel state to the parallel state. However, the description can be similarly applied to a case where the state is changed from the parallel state to the antiparallel state.

Meanwhile, an electric field stress is applied to the tunnel insulating layer of the memory device 2 in accordance with the application of the write voltage. Repeated stresses finally bring the tunnel insulating layer to electrostatic breakdown. The electrostatic breakdown of the tunnel insulating layer is modeled as below.

Here, a case where the write unit repeatedly performs voltage application of the memory device 2 with a specific write voltage will be considered.

The probability r of breakdown of the memory device 2 until the write voltage is applied x times is represented in the following equation.

$$r = 1 - \exp(-(x/\mu)^\beta) \quad (1)$$

Equation (1) represents a Weibull distribution. β represents the shape of the distribution and is in the range of about 1 to 2 for the memory device 2 used in the SpRAM1. μ is an average number of writable times and depends on the write voltage.

The write voltage dependency of μ can be described as a so-called power law model and is represented in the following equation.

$$\mu = x1 \times V^{-b} \quad (2)$$

Here, x1 is an average number of writable times for the write voltage of 1 V, and b is a parameter used for determining the voltage dependency.

Commonly, x1 is in the range of about $10^4$ to $10^{10}$, and b is in the range of about 40 to 60. As can be known from Equation (2), as the write voltage is increased, the value of μ decreases, and accordingly, the breakdown probability (=breakdown error rate) increases. Therefore, in order to decrease the breakdown error rate of the memory device 2, it is preferable that the write operation is performed by using a low write voltage.

As described above, in the SpRAM1, the write error rate and the breakdown error rate have opposite dependency on the write voltage. Accordingly, it can be understood that the write error rate and the breakdown error rate are in a trade-off relationship. In order to implement a memory of a high capacity, it is necessary that a sufficiently large difference between a write voltage achieving a desired write error rate and a write voltage achieving a desired breakdown error rate (write margin) is secured.

Thus, as a result of various reviews, the inventors of the present invention and others found that the write margin can be increased by allowing the write unit to supply a write current in which a write voltage is configured by two or more independent pulse trains to the memory device 2.

Subsequently, a concrete example of a write control method used in the SpRAM1 will be described.

As described above, whether a write operation will be successful or failed in accordance with the application of a write voltage is probabilistic. As shown in FIG. 3, in a case where a write operation is performed by using a voltage Va., the write error ratio is represented to be $10^{-4}$. Accordingly, it can be said that one write operation out of 10,000 write operations is failed. At this time, a write current of one pulse shown in FIG. 4A flows through the memory device 2. Subsequently, when a write operation is performed one more time by using the same voltage Va., also in such a case, one write operation out of 10,000 write operations is failed.

Figure 4A:
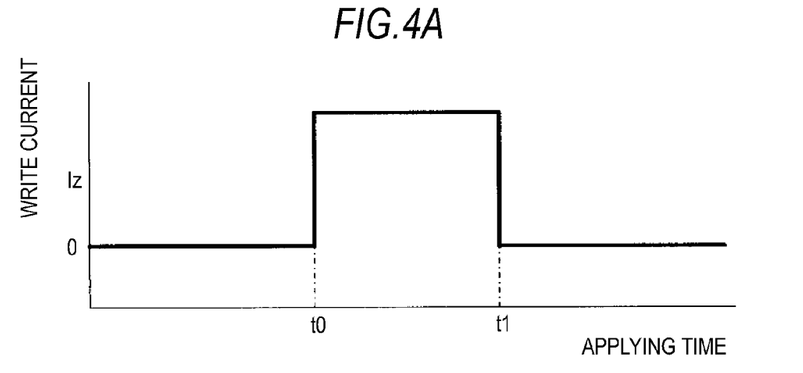
FIGS. 4A and 4B are diagrams representing time dependency of a write current applied to a memory layer according to the first embodiment.
Figure 4B:
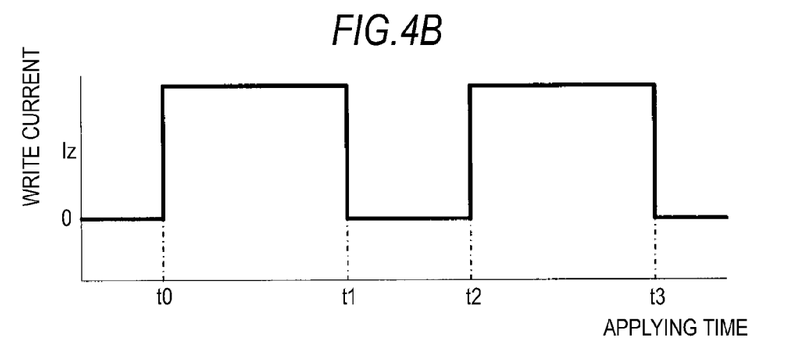

When being brought together, as shown in FIG. 4B, it is apparent that the two write operations correspond to a write operation using two continuous pulse trains. When at least one write operation out of the two write operations is successful, the data can be rewritten. Accordingly, the write error rate of the write operation using the two pulse trains is represented as $10^{-4} \times 10^{-4} = 10^{-8}$. In other words, the write error rate becomes the square of the above-described write error rate. Here, the write error rate of the write operation using two pulse trains is denoted by black dots 35 in FIG. 3. This write error rate corresponds to a write error rate for a case where the write voltage is Vb.

Next, a change in the breakdown error rate according to the write operation using the two pulse trains will be described.

Since the write operation is performed by using two pulse trains, the stress applied to the tunnel insulating layer becomes twice the stress of the case of a single pulse. When the number of the write operations is x, the breakdown error rate r1 for one pulse is represented by the following equation.

$$r1 = 1 - \exp(-(x/\mu)^\beta) \quad (3)$$

In addition, the breakdown error rate r2 for the two pulse trains is represented by the following equation.

$$r2 = 1 - \exp(-(2x/\mu)^\beta) \quad (4)$$

The breakdown error rate has a value extremely smaller than "1" (r1 and r2 <<1). Thus, when being expanded in a series, r2≈2×r1. Accordingly, it appears that, while the write error rate decreases by being squared, the breakdown error rate increases by being doubled. Based on this difference, the write margin can be increased by performing the write operation using two pulse trains. As the number of the pulse trains is increased, the above-described advantage further increases.

In the discussion presented above, the write error rate for a case where a single memory device 2 is used has been described. However, in a case where the SpRAM1 is practically used, a write error rate for a plurality of the memory devices 2 is actually used. Generally, the write error rate varies for each memory device 2. Thus, two error rates are defined as below.

First, the rate of memory devices 2 for which a write operation is failed in a case where the write operation is performed at a specific write voltage for a plurality of memory devices 2 is defined as a bit error rate. The bit error rate corresponds to an average value of the write error rates of the memory devices 2. On the other hand, since the Weibull distribution is originally a model designed for a plurality of memory devices 2, the breakdown error rate is originally a bit error rate for a plurality of memory devices 2.

Next, a device error rate is defined as a probability of a failure of at least one write operation for a case where the write operations are performed a necessary number of times for the SpRAM1 that is configured by a plurality of memory devices 2. The device error rate is an index that represents the performance of a memory device including the SpRAM1. A necessary level of the device error rate depends on an application using the device or the like. Typically, the device error rate has a value in the range of $10^{-6}$ to $10^{-4}$.

Next, a method of acquiring the device error rate from the bit error rate will be represented. Here, it is assumed that the memory device has an error correction function (ECC).

Here, N is the capacity of memory, n is the number of code bits of the ECC, k is the number of data bits of the ECC, s is the number of error correction bits, b=N/k is the number of blocks, and x is the number of times of writing.

In such a case, the relationship between the device error rate Rd and the bit error rate Rb for writing is represented by the following equation.

$$Rd = 1-(1-F[n,s,Rb]\hat{}(bx)) \quad (5)$$

Here, F[n, s, r] is a function representing the block error rate and is represented by the following equation.

$$F(n, s, r) = \sum_{m=s+1}^{n} \binom{n}{m} r^m (1-r)^{n-m} \quad (6)$$

Since the number of times of writing is included in the bit error rate Rb, the device error rate Rd for breakdown is represented by the following equation, similarly.

$$Rd = 1-(1-F[n,s,Rb]\hat{}(b)) \quad (7)$$

Here, a detailed calculation example is presented. When N=76k bytes, n=12, k=8, s=1, x=1,000,000, a necessary bit error rate Rb for writing for achieving Rd=1/10,000 is $4.4 \times 10^{-9}$.

Next, in order to verify the effect of a write operation using continuous independent pulse trains of two or more, the error rates were calculated based on the actually measured data. The preconditions of values are the same as those in the above-described calculation example.

First, in order to acquire the bit error rate Rb for a write voltage, the write error rates of 128 memory devices 2 were measured.

Figure 5:
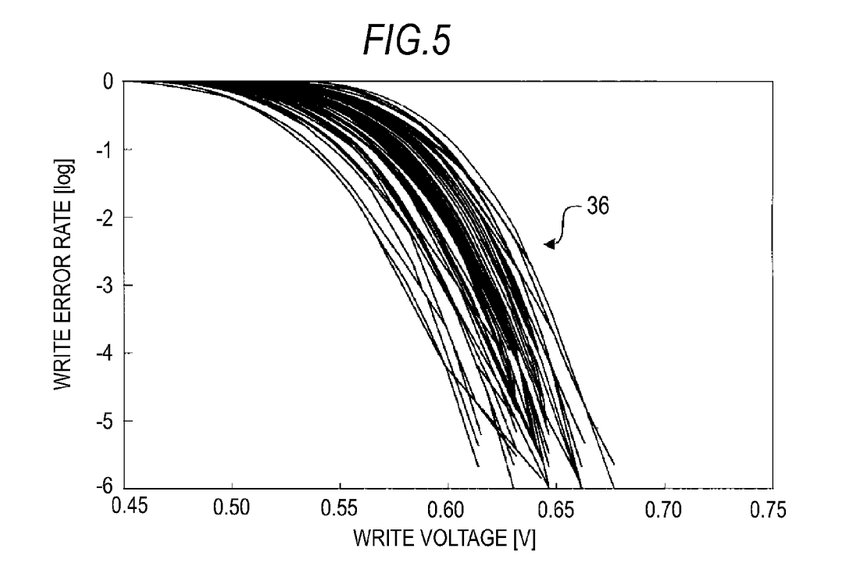
FIG. 5 is a result of measurement of the dependency of a write error rate on a write voltage in a plurality of devices according to the first embodiment.

FIG. 5 represents the result of measurement of the write error rates for write voltages.

One curve 36 shown in FIG. 5 represents a write error rate of one memory device 2. By repeatedly performing a writing measurement $10^6$ times in the measurement of the write error rate, the write error rate up to $10^{-6}$ is acquired. By performing such a measurement, the curve 36 approximating the cumulative frequency distribution of the write error rates for a specific write voltage is acquired. By performing numeric integration of the curve 36 in the range of all the bits, the write bit error rate Rb is acquired.

Figure 6:
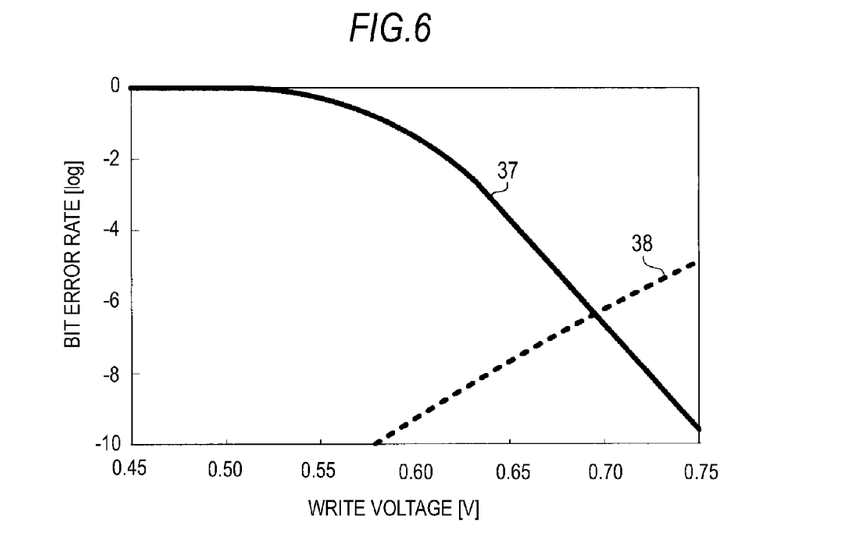
FIG. 6 is a schematic diagram illustrating an example of calculation of a write error rate and a breakdown bit error rate according to the first embodiment.

FIG. 6 represents an example of a bit error rate Rb for a write voltage.

Since the write error rate that is equal to or smaller than $10^{-6}$ is not acquired from a measurement, the measurement result is calculated by extrapolating the measurement result as a straight line.

Here, a solid line 37 represents a write error rate, and a broken line 38 represents a breakdown bit error rate Rb.

The breakdown bit error rate Rb can be acquired by determining a Weibull distribution and parameters of a power law model through a regular stress test in which a time is measured until the breakdown of the memory device 2 by applying a constant write voltage to a plurality of memory devices 2. As described above, the write bit error rate decreases as the write voltage is increased. On the contrary, the breakdown bit error rate Rb increases as the write voltage is increased.

Figure 7:
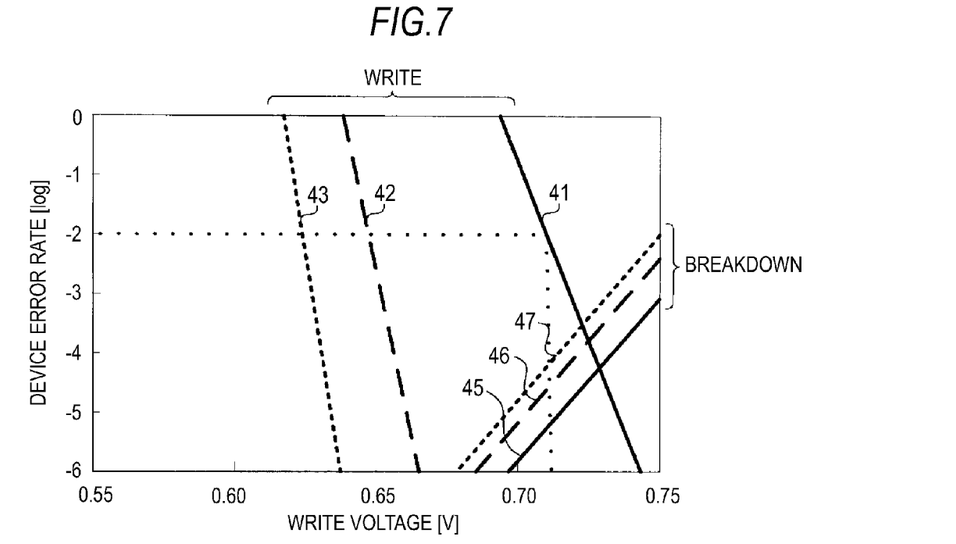
FIG. 7 is a schematic diagram illustrating an example of result of calculation of a write error rate and a breakdown device error rate according to the first embodiment.

FIG. 7 shows an example of the device error rate Rd that is calculated by using the above-described Equation (6).

Here, a line 41 represents a device error rate for a case where a general write operation using a single pulse is performed. On the other hand, lines 42 and 43 represent resultant device error rates for cases where write operations using independent pulse trains of two or more are performed, which are performed for the SpRAM 1 of this example. The lines 42 and 43 correspond to writing of a double pulse and writing of a triple pulse. According to the writing of the double pulse and the writing of the triple pulse, compared to the writing of the single pulse, the write device error rate Rd markedly decreases.

In addition, the breakdown device error rates Rd are represented by lines 45 to 47. Accordingly, while the write device error rate Rd markedly decreases, the breakdown device error rate Rd increases. However, as shown in the figure, the degree of the increase in the breakdown device error rate Rd is relatively low. The reason is as follows. While the write device error rate Rd decreases in a square pattern and a cube pattern, the breakdown device error rate Rd increases to be doubled and tripled only.

The intersection of the write device error rate Rd and the breakdown error rate Rd becomes an operation point at which the entire error rate decreases the most. Here, in the case of the single pulse, the error rate is about $10^{-3}$ at the write voltage of 0.72 V. However, In the case of the double pulse, the error rate is enhanced to be about $10^{-5}$ at the write voltage of 0.66 V. As described above, by using the SpRAM 1 of this example, the write device error rate Rd and the breakdown device error rate Rd decrease even at a low write voltage.

The above-described result will be presented in detailed values. However, since the write voltage depends on the material, the device resistance, and the like of the memory device 2, the write voltage is normalized by a reference value. First, in order to determine the reference value of the write voltage, the voltage at which the bit error rate becomes 1/2 is set as Vc0. In this example, as shown in FIG. 6, Vc0=0.55 V. In a case where the write voltage is evaluated by using this value as a reference, a necessary device error rate is assumed to be $10^{-5}$. In a general write control method using a single pulse, the write voltage is 0.74 V=1.35×Vc0. On the other hand, in the write control methods using the double pulse and the triple pulse, which are used in the SpRAM1 of this example, the write voltages are 0.66 V=1.20×Vc0 and 0.63 V=1.14×Vc0.

As described above, generally, a write voltage that is 1.35 times the reference voltage is applied to the memory device 2. However, by using the write control method of this example, it is apparent that a necessary device error rate Rd can be achieved by applying a write voltage that is equal to or smaller than 1.2 times the reference voltage to the memory device 2.

Generally, data is written by using a single pulse. However, according to the write control method of the above-described first embodiment, data is written by using a plurality of continuous pulse trains such as a double pulse or a triple pulse. Accordingly, the write error rate, the bit error rate Rb, and the device error rate Rd can be decreased while the write voltage is lowered. Accordingly, the load applied to the memory device 2 can be lowered. Therefore, there is an advantage in that the working lifetime of the memory device 2 can be lengthened.

<2. Second Embodiment>

[Example of Changing Number of Pulse Trains by Determining Whether Writing is Successful]

Next, a second embodiment of the present invention will be described.

In this example, an SpRAM 50 that determines whether or not writing is successful based on the content of the output of a sense amplifier 10 in the middle of applying a write voltage to a memory device 2 by using independent pulse trains of two or more is used. In the description below, to each portion corresponding to that shown in FIG. 1 described in advance as the first embodiment, a same reference sign is assigned, and a detailed description thereof is omitted.

Figure 8:
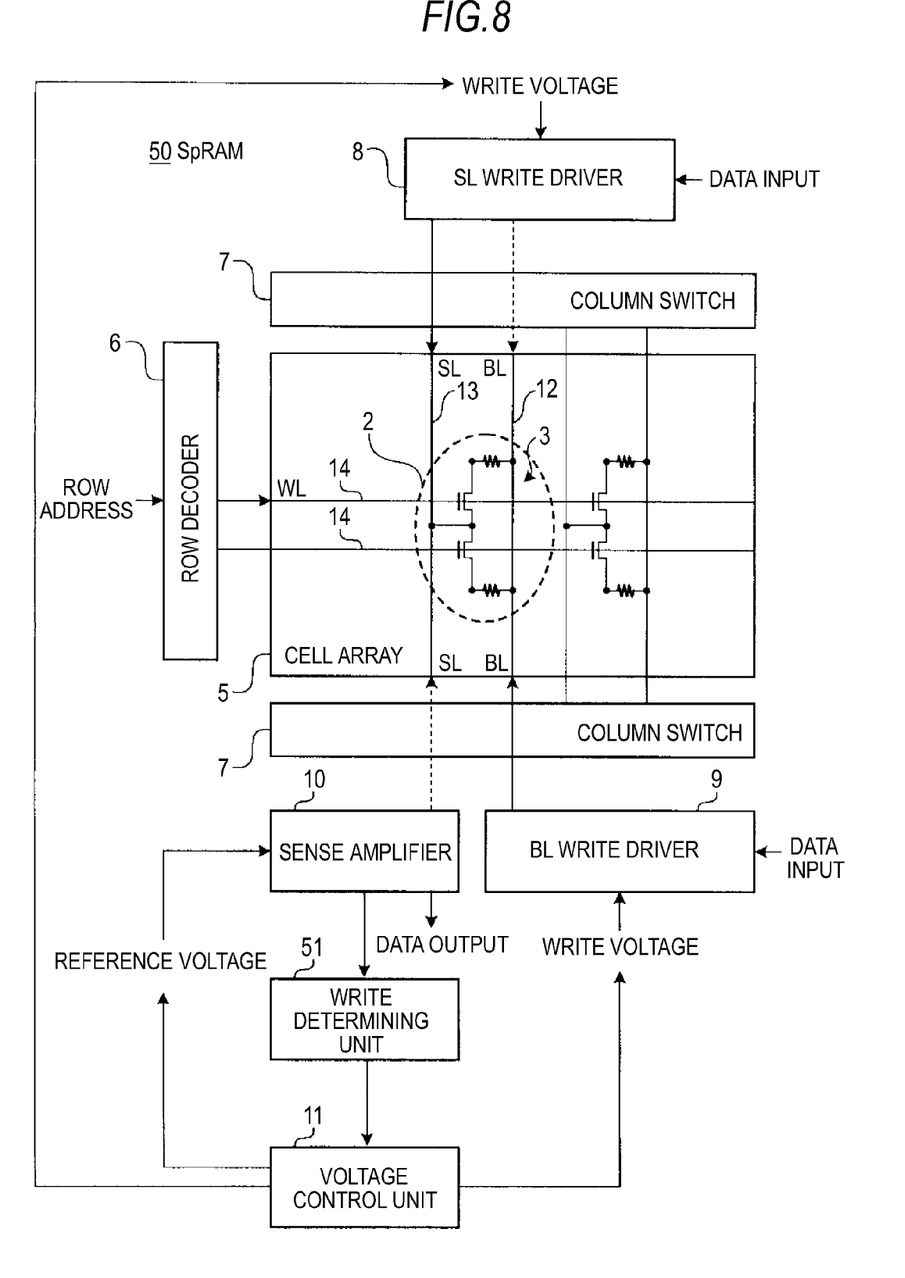
FIG. 8 is a functional block diagram representing an internal configuration example of an SpRAM according to a second embodiment of the present invention.

FIG. 8 shows an example of the internal configuration of the SpRAM 50 of this example.

The SpRAM 50 includes a write determining unit 51 that determines whether writing data into the memory device 2 has been successful based on the voltage value output from the sense amplifier 10. The write determining unit 51 detects a change in the magnetization direction of a memory layer in the process of sequentially applying a write current formed by independent pulse trains of two or more to the memory device 2. In a case where the write determining unit 51 detects a change in the magnetization state of the memory layer, the voltage control unit 11 controls supply of the write voltage so as not to apply the write current formed by pulse trains thereafter to the memory device 2.

Figure 9:
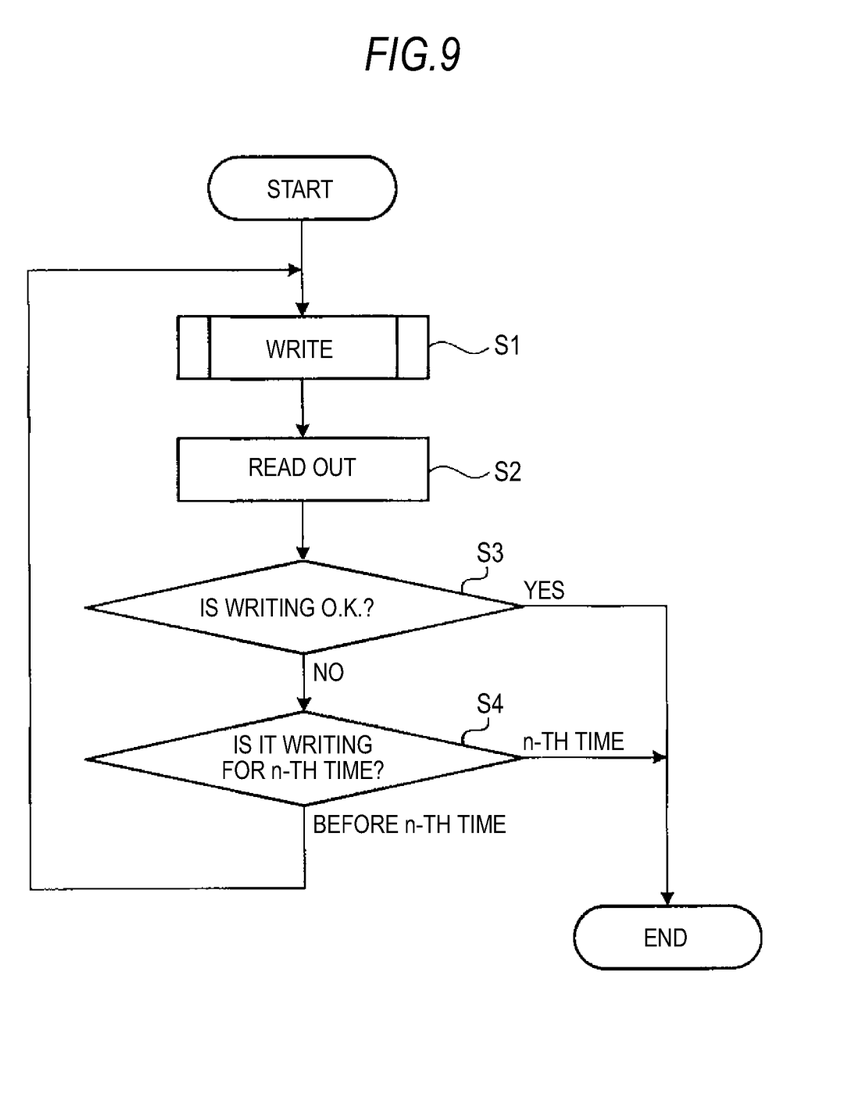
FIG. 9 is a flowchart representing an example of a write control method for the SpRAM according to the second embodiment.

FIG. 9 is a flowchart representing an example of a writing process performed for the memory device 2.

First, the write unit to which a write voltage is supplied writes data into the memory device 2 by using a first pulse (Step S1). Next, the sense amplifier 10 reads out a sense voltage from the memory device 2 and transmits a result acquired by comparing the sense voltage and a reference voltage to each other to the write determining unit 51 (Step S2).

The write determining unit 51 determines whether or not the writing of data into the memory device 2 is successful based on the result (Step S3). In a case where the write determining unit 51 determines that the writing is successful, the write unit completes the process without performing further writing thereafter.

On the other hand, determining that the writing is failed, the write determining unit 51 determines whether the number of times of writing is the n–th time (Step S4). Here, the n–th time represents the pulse train number. This is based on that there may be a case where the number of the pulse trains of the write voltage is three or more in addition to a case where the number of the pulse trains is two.

When the write determining unit 51 determines that the number of times of writing is smaller than n, the process proceeds to Step S1, and writing is performed again. On the other hand, when the number of times of writing is determined to be n, a write error is determined, and the process is completed.

On the other hand, when the SpRAM of this example 50 detects that writing is successful in the middle of applying independent pulse trains of two or more, the SpRAM 50 does not apply pulse trains thereafter. Since the write error rate is basically low, in many cases, writing is successful by applying the first pulse. Then, the writing is completed under the control of the voltage control unit 11, unnecessary stress is not applied to the tunnel insulating layer of the memory device 2. As a result, an increase in the breakdown device error rate Rd can be prevented. In particular, as the sense amplifier 10 reads out the sense voltage between t1 and t2 shown in FIG. 4B, the write determining unit 51 can detect whether writing is successful or failed by the applying of the first pulse.

In addition, in a case where writing is successful while writing by using independent pulse trains of two or more is performed, and a pulse is not applied thereafter, the write device error rate Rd is as represented in FIG. 7. However, the breakdown device error rate Rd of the case of a double pulse or a triple pulse is the same as that of the case of a single pulse that is represented by line 45. Accordingly, writing is performed further, and a margin is increased.

According to the above-described write control method of the second embodiment, in a case where a write voltage is applied to the memory device 2 by using independent pulse trains of two or more, it is determined whether or not writing is successful when the write voltage is applied. Then, when the writing is successful, the writing process is completed, whereby unnecessary stress is not applied to the memory device 2. Accordingly, there is an advantage in that the breakdown device error rate Rd can be suppressed.

<3. Modified Examples>

In addition, in the memory device 2 according to the above-described first and second embodiments, the magnetization fixed layer 15 is formed on a lower layer of the memory layer 16. However, a configuration in which the magnetization fixed layer is formed on an upper layer of the memory layer 16 may be used.

In addition, in this embodiment, the magnetization fixed layer 15 is configured by two layers of the ferromagnetic layers 22 and 24. However, the number of the ferromagnetic layers configuring the magnetization fixed layer 15 is not particularly limited.

In addition, in this embodiment, the magnetization fixed layer 15 is formed only on a lower layer of the memory layer 16. However, a configuration in which a different magnetization fixed layer is formed on an upper layer of the memory layer 16, and the memory layer 16 is interposed between the two magnetization fixed layers may be used. At this time, the direction of magnetization of a layer of the ferromagnetic layers, which configures the different magnetization fixed layer, located closest to the memory layer 16 is preferably fixed in a direction opposite to the direction of magnetization of the ferromagnetic layer 24 configuring the magnetization fixed layer 15. In addition, the layer that separates the different magnetization fixed layer from the memory layer 16 may be an insulating body, similarly to the tunnel insulating layer 25, or may be nonmagnetic metal such as Ru, Ta, Cr, or Cu.

In addition, the pulse train that is used for writing has a rectangular shape in FIGS. 4A and 4B. However, the pulse may have any shape as long as it can be used for writing. For example, in a rising edge or a falling edge of a pulse or both the rising edge and the falling edge, a time of several ns to several tens of ns may be set. In addition, the number of the pulse trains is not limited to two or three as shown in FIG. 7. Thus, more pulse trains may be used.

The pulse width t1–t0 or t3–t2 of each pulse train shown in FIG. 4B can be adjusted in accordance with the characteristics of the memory device 2 or a desired error rate. As the pulse width becomes longer, the write error rate further decreases, and the breakdown error rate tends to increase. Typically, it is preferable that the pulse width is in the range of about 10 ns to 300 ns. The pulse widths of pulse trains may be uniformly set to a same width or may be set to different widths.

In addition, in order to shorten the write time, a gap t2−t1 between pulses is preferably configured to be small as possibly as it can be. However, the gap is set to be long to some degree, so that writings by using two pulses can be treated to be independent from each other. For example, when t2−t1=0 as the extremity, writing using one pulse having a double length is performed. However, in such a case, the write error rate is not increased in the square pattern. The reason is that the writing events are not independent from each other. In order to significantly decrease the write error rate, it is preferable that the gap between the pulses is equal to or longer than 10 ns.

In addition, in FIG. 4B, an example in which the current values of the two pulse trains are the same is shown. However, the current values of the two pulse trains may be configured to be different from each other, as is necessary.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A memory comprising:
a memory device that has a memory layer storing data as a magnetization state of a magnetic body and a magnetization fixed layer whose direction of magnetization is fixed through a nonmagnetic layer interposed between the memory layer and the magnetization fixed layer and stores the data in the memory layer by changing a magnetization direction of the memory layer when a write current flowing in a stacked direction of the memory layer and the magnetization fixed layer is applied; and
a voltage control unit configured to supply the write current configured by continuous independent pulse trains of two or more to the memory device by using a write voltage that is configured by continuous independent pulse trains of two or more.

2. The memory according to claim 1, further comprising:
a write determining unit that detects the magnetization state of the memory layer in sequentially applying the write current that is configured by the continuous independent pulse trains of two or more to the memory device,
wherein, in a case where the write determining unit detects a change in the magnetization state of the memory layer, the voltage control unit does not apply the write current that is configured by the pulse trains thereafter to the memory device into which the data is written.

3. The memory according to claim 1, wherein the magnetization fixed layer is formed by a plurality of ferromagnetic layers that are stacked through a nonmagnetic layer.

4. The memory according to claim 1, wherein, in a case where an average write voltage of the memory at a singe pulse is Vc0, the voltage of the continuous independent pulse trains of two or more is equal to or lower than $1.2 \times Vc0$.

5. The memory according to claim 4, wherein the average write voltage of the memory at a single pulse Vc0 is a voltage at which a bit error rate becomes 1/2.

6. A write control method for storing data in a memory device that has a memory layer storing data as a magnetization state of a magnetic body and a magnetization fixed layer whose direction of magnetization is fixed through a nonmagnetic layer interposed between the memory layer and the magnetization fixed layer and stores the data in the memory layer by changing a magnetization direction of the memory layer when a write current flowing in a stacked direction of the memory layer and the magnetization fixed layer is applied, the write control method comprising:
supplying the write current configured by continuous independent pulse trains of two or more to the memory device at a write voltage that is configured by continuous independent pulse trains of two or more.

7. The write control method according to claim 6, further comprising not applying the write current configured by the pulse trains thereafter in a case where a change in the magnetization state of the memory layer is detected in sequentially applying the pulse trains to the memory device.

8. The write control method according to claim 6, wherein the magnetization fixed layer is formed by a plurality of ferromagnetic layers that are stacked through a nonmagnetic layer.

9. The write control method according to claim 6, wherein, in a case where an average write voltage of the memory at a singe pulse is Vc0, the voltage of the continuous independent pulse trains of two or more is equal to or lower than $1.2 \times Vc0$.

10. The write control method according to claim 9, wherein the average write voltage of the memory at a single pulse Vc0 is a voltage at which a bit error rate becomes 1/2.

* * * * *